United States Patent
Abdulla

(10) Patent No.: US 8,289,767 B2
(45) Date of Patent: *Oct. 16, 2012

(54) PROVIDING A READY-BUSY SIGNAL FROM A NON-VOLATILE MEMORY DEVICE TO A MEMORY CONTROLLER

(75) Inventor: Mostafa Naguib Abdulla, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/276,570

(22) Filed: Oct. 19, 2011

(65) Prior Publication Data

US 2012/0039118 A1 Feb. 16, 2012

Related U.S. Application Data

(63) Continuation of application No. 12/335,587, filed on Dec. 16, 2008, now Pat. No. 8,064,250.

(51) Int. Cl.
*G11C 16/04* (2006.01)
(52) U.S. Cl. .......... 365/185.02; 365/185.04; 365/189.03
(58) Field of Classification Search ............ 365/189.11, 365/189.03, 189.09, 185.02, 185.04
See application file for complete search history.

(56) References Cited

U.S. PATENT DOCUMENTS

| | | | |
|---|---|---|---|
| 4,532,587 A | 7/1985 | Roskell et al. | |
| 6,771,526 B2 | 8/2004 | LaBerge et al. | |
| 7,293,208 B2 | 11/2007 | Hobara | |
| 7,620,783 B2 | 11/2009 | Wolford et al. | |
| 8,064,250 B2 * | 11/2011 | Abdulla | 365/185.02 |
| 2006/0066384 A1 | 3/2006 | Jain | |
| 2007/0148796 A1 | 6/2007 | Nakamura et al. | |
| 2008/0284467 A1* | 11/2008 | Koo | 326/30 |
| 2009/0003090 A1* | 1/2009 | Kim et al. | 365/189.11 |

FOREIGN PATENT DOCUMENTS

| | | |
|---|---|---|
| CN | 101783175 | 7/2010 |
| DE | 102009058348.3-55 | 6/2010 |
| JP | 2000353382 | 12/2000 |
| JP | 2006203405 | 8/2006 |
| JP | 2009-282802 | 7/2010 |
| KR | 2007-0044790 | 4/2007 |
| KR | 10-2009-125649 | 6/2010 |
| SG | 20090007643-1 | 7/2010 |

OTHER PUBLICATIONS

Chinese Office Action, Chinese Office Action issued in corresponding Application No. 101783715, dated Nov. 1, 2011.

(Continued)

*Primary Examiner* — Richard Elms
*Assistant Examiner* — Hien Nguyen
(74) *Attorney, Agent, or Firm* — Dorsey & Whitney LLP

(57) ABSTRACT

A common standard may be used for both dynamic random access memories and non-volatile memories, despite the fact that the non-volatile memory generally needs bidirectional communications to coordinate writing with a memory controller. In one embodiment, a package connector on the non-volatile memory may be used for one function that does not involve communications with the memory controller during reading and may be used for communications with the memory controller during writing. Particularly, those communications during writing may be to indicate to the memory controller when the memory is ready for writing and when the memory is busy so that a write must be deferred until the memory is ready to be written to.

14 Claims, 2 Drawing Sheets

OTHER PUBLICATIONS

Korean Patent Office, Korean Office Action issued in corresponding Application No. KR 2009125649 dated Jun. 30, 2011.
Singapore Patent Office, Singapore Office Action issued in corresponding Application No. 20090007643-1 dated Nov. 17, 2009.
U.S. Appl. No. 13/276,570, filed Oct. 19, 2011, Office Action issued Mar. 15, 2012.
JP Office Action issued Apr. 17, 2012 for JP Appl. No. 2009-282802.
Office Action dated Apr. 5, 2012 for Korean Application No. 10-2009-125649.

* cited by examiner

PROVIDING A READY-BUSY SIGNAL FROM A NON-VOLATILE MEMORY DEVICE TO A MEMORY CONTROLLER

CROSS-REFERENCE TO RELATED APPLICATIONS

This application is a continuation of U.S. patent application Ser. No. 12/335,587, filed on Dec. 16, 2008 now U.S. Pat. No. 8,064,250. "It has matured into a patent."

BACKGROUND

This relates generally to non-volatile memory devices. A non-volatile memory is a device that stores information even when power is unavailable.

Examples of non-volatile memories include phase change memory devices and flash memory devices. Generally, non-volatile memory devices communicate with a processor-based system through a memory controller.

Non-volatile memories may be used as replacements for dynamic random access memories. For example, the synchronous dynamic random access memory (SDRAM) may be replaced by non-volatile memories in the future. The JEDEC Solid State Technology Association (Arlington, Va. 22201) is working on a standard called low power double data rate ("LPDDR2") for a memory with low power and high speed for both DRAM and non-volatile memory. LPDDR2 reduces pin count to reduce package size for both the memory and the host processor and thereby to reduce system cost. However, reducing pin count also limits signaling between the memory and the memory controller.

DETAILED DESCRIPTION

Figure 1:
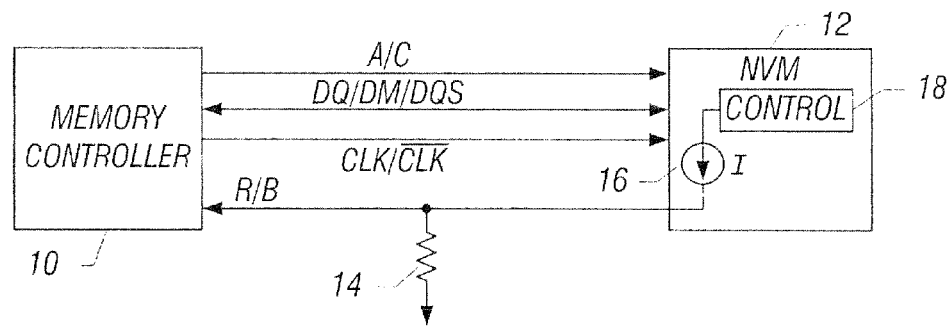
FIG. 1 is a schematic depiction of one embodiment of the present invention.

Dynamic random access memory (DRAM) devices may be replaced by non-volatile memory technology such as phase change memories. The dynamic random access memory has a deterministic writing time. Each write cycle is defined by a number of clock cycles needed to write, which makes the dynamic random access memory a passive device that does not need to communicate with a memory controller during write or read.

A non-volatile memory writing/programming time is undetermined. For example, if a memory controller wants to write data to a non-volatile memory device, the non-volatile memory device may be busy doing something in the background or still verifying the previously programmed data. To overcome this issue, some non-volatile memory devices may have a ready/busy (R/B) output pin. That pin is used to send a wait signal to the controller if the controller is trying to write to the memory and the non-volatile memory is busy. The controller is thereby advised to retry writing later.

However, the LPDDR2 JEDEC standard reduces the number of pins to reduce the package size for both the memory and the host processor as a way to reduce system cost. One pin that may be eliminated is the R/B output pin. Thus, under this proposal, the undetermined writing time for non-volatile memories that substitute for dynamic random access memories becomes an issue.

The proposed LPDDR2 JEDEC standard does provide a data not valid (DNV) signal to the controller only during the read mode. The data not valid signal uses an input data mask/data not valid (DM) pin only during the read mode since the DM pins are used during the write mode to mask the data.

As used herein, a "package connector" includes any lead or conductor used to obtain an output signal from an integrated circuit, including pins, prongs, lands, contacts, terminals, plugs, balls, and springs.

In accordance with some embodiments, another package connector that is unused during the write mode may be used as an output signal from the non-volatile memory to the memory controller. One suitable package connector is the ZQ pin. The ZQ pin is used conventionally to enable the memory device to calibrate its output drive strength. The ZQ pin is connected to an external resistor (which typically is 240 ohms). The ZQ pin is only conventionally used during calibration mode and is not conventionally intended for communications with the memory controller.

The ZQ pin can be used for data communications during writes, as a ready/busy pin during a writing operation to the non-volatile memory device. During writing, the calibration mode is off.

Thus, the ZQ pin can be used in the following fashion. In one embodiment, a current of 5 milliAmps may be driven through the ZQ resistor. In this example, the non-volatile memory device generates 1.2 volts at the ZQ pin. The presence of this voltage on the ZQ pin is used to interrupt the controller to indicate that the memory is busy. It may also be considered a wait signal. When the ZQ pin is asserted high, that means the non-volatile memory device is busy and the controller cannot write in one embodiment. When the non-volatile memory is ready for write, the ZQ pin may be pulled low again in one embodiment. Of course the opposite polarities may be used as well. Also, the signal provided from the ZQ pin may be a continuous signal or pulses, depending on whether the retry is short or long.

Thus, referring to FIG. 1, a non-volatile memory 12 which may, for example, be a phase change memory, includes a current source 16 coupled to the ZQ pin, indicated as R/B for ready/busy in FIG. 1. The non-volatile memory communicates the ready/busy signal to the memory controller 10. It also communicates addresses and commands (A/C) and other signals, including data inputs/outputs (DQ), DM, and data strobe (DQS) signals. Clock (CLK) signals and clock bar signals may also be communicated from the memory controller to the non-volatile memory.

The memory 12 may include a control 18 that controls the current source 16. The control 18 may be implemented in hardware, software, or firmware. The control 18 may be an embedded processor or logic, as examples.

Figure 2:
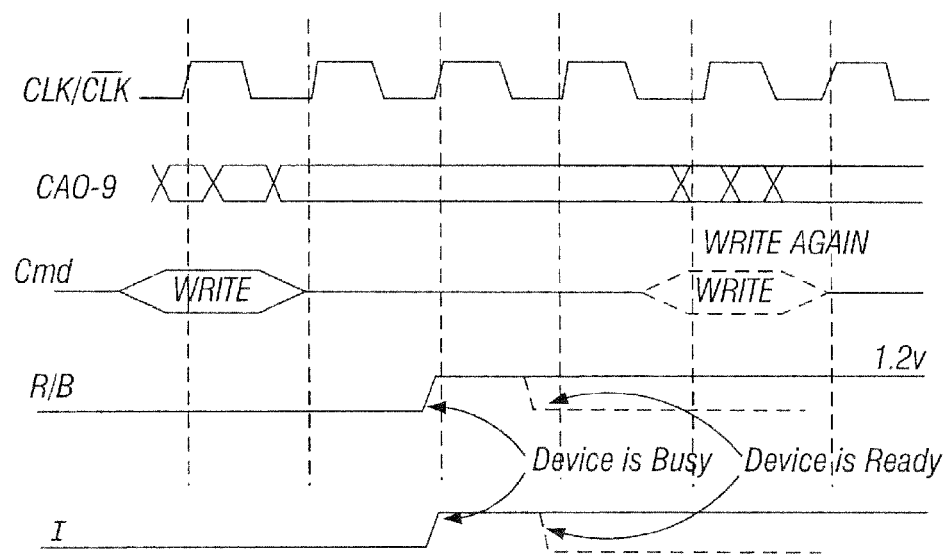
FIG. 2 is a timing diagram for the embodiment shown in FIG. 1.

Thus, in FIG. 2, the clock and clock bar signals are depicted at the top, followed by the command/address inputs CA0-9 and the write command signals Cmd. Note that the first write command signal initiates a request to write to the non-volatile memory which is rejected by the non-volatile memory, as signaled by the ready/busy (R/B) signal. Namely, the current I in the non-volatile memory device generates a high level on the ready/busy line to the memory controller 10 indicating that the write should be retried.

The write command (CMD) is then tried again, as indicated in dashed lines on the command timing diagram. When the device is no longer busy and is then ready, as indicated in dotted lines, the R/B level may be lowered and the current from the current source I may be turned off. This signals to the memory controller that the non-volatile memory is now ready to write again and this may be followed up, as indicated by dotted lines on the line Cmd, by issuing another write command.

Figure 3:
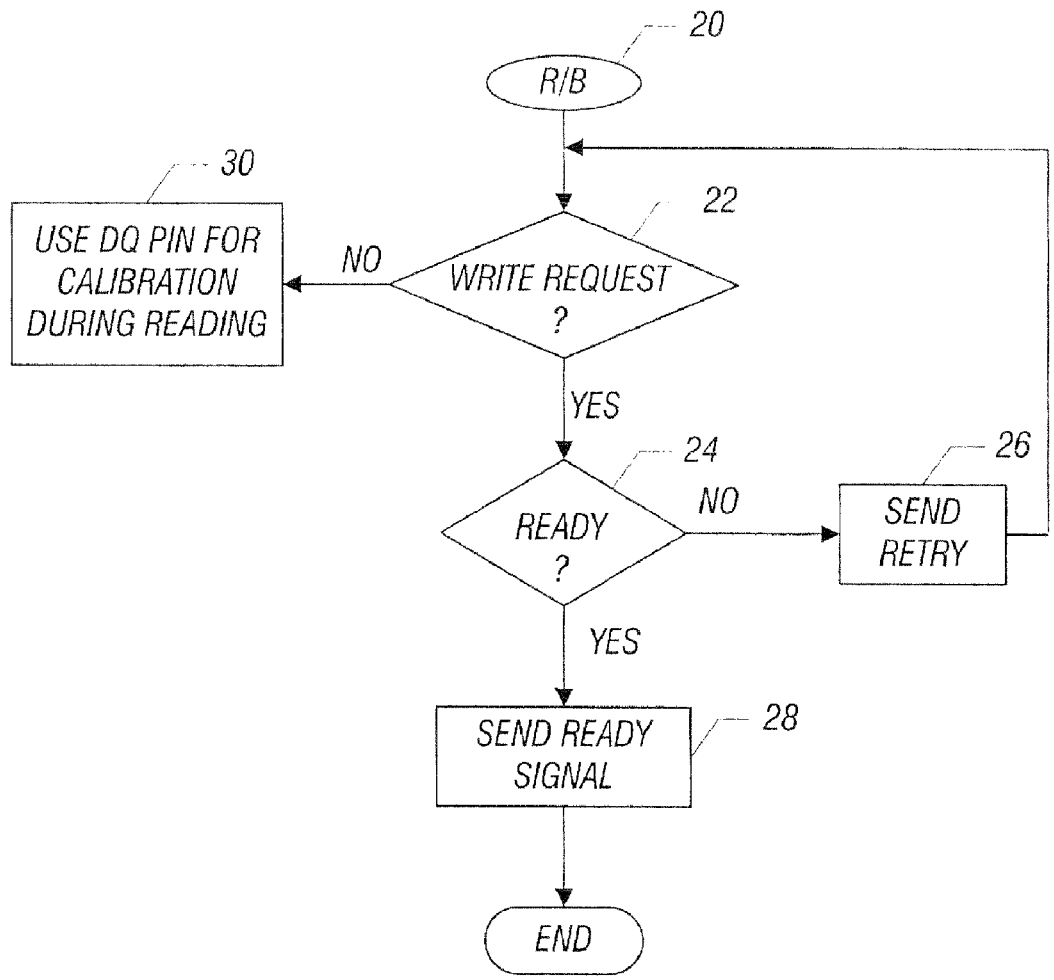
FIG. 3 is a flow chart for one embodiment.

Referring to FIG. 3, a sequence is illustrated which may be implemented in software, hardware, or firmware. In some embodiments, a computer readable medium may store instructions that, when executed, enable the sequence to be implemented. For example, the sequence may be implemented by the control 18, shown in FIG. 1.

Initially, a check at diamond 32 determines whether or not a write request has been received from the memory controller. If not, a read mode is implemented and, in the case of a ZQ pin, this means implementing the calibration mode, as indicated at block 30.

If a write was requested, as determined at diamond 22, a check determines whether or not the memory is available and ready for a write, as indicated in diamond 24. If so, the ready signal is provided on the ZQ pin in one embodiment, indicated at block 28. Otherwise, a wait or retry signal is issued to signal the memory controller to wait until the memory is no longer occupied to implement the write command (block 26). From here, the flow iterates until such time as the memory is free (as determined at diamond 24) and the write can be implemented (as indicated at block 28).

While an embodiment is described in which the non-volatile memory device is a phase change memory and the product is the low power double data rate, this same technology may be useful in any situation where a ready/busy dedicated pin is unavailable for whatever reason.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-volatile memory comprising:
a package connector; and
a control to generate a first signal on the connector to indicate the memory is busy and to generate a second signal on the connector to indicate that a write to the memory should be retried.

2. The memory of claim 1 wherein said connector is a calibration pin.

3. The memory of claim 2 wherein said connector is a ZQ pin.

4. The memory of claim 2 wherein said memory includes a current source selectively couplable to a said ZQ pin.

5. The memory of claim 4 wherein said pin is coupled to a grounded resistor.

6. The memory of claim 5 wherein said control to generate a ready/busy signal by generating a current from said current source coupled to ground through said resistor.

7. The memory of claim 1 wherein said memory is a phase change memory.

8. A method comprising:
generating a first signal on a connector to indicate if the memory is busy; and
generating a second signal on the connector to indicate that a write to the memory should be retried.

9. The method of claim 8 including using said connector to indicate when the memory is busy and cannot be written.

10. The method of claim 8 including using as said connector a calibration pin.

11. The method of claim 10 including using a ZQ pin as said calibration pin.

12. The method of claim 8 including using as said connector a pin including a connection to ground through a resistor.

13. The method of claim 8 including using said connector to indicate when to retry a write to the memory.

14. The method of claim 13 including using said connector for calibration of the memory during reading.

* * * * *